US011777307B2

(12) United States Patent
Barker et al.

(10) Patent No.: US 11,777,307 B2
(45) Date of Patent: Oct. 3, 2023

(54) ELECTRONIC VALVE APPARATUS (71) Applicant: General Electric Technology GmbH, Baden (CH)

(72) Inventors: Carl D. Barker, Stafford (GB); Colin Charnock Davidson, Staforrd (GB); John Lewis Outram, Stafford (GB); Timothy James Stott, Stoke-on-Trent (GB); Robert Stephen Whitehouse, Stafford (GB)

(73) Assignee: General Electric Technology GmbH, Baden (CH)

( * ) Notice: Subject to any disclaimer, the term of this patent is extended or adjusted under 35 U.S.C. 154(b) by 374 days.

(21) Appl. No.: 17/270,369

(22) PCT Filed: Aug. 14, 2019

(86) PCT No.: PCT/EP2019/071808
§ 371 (c)(1),
(2) Date: Feb. 22, 2021

(87) PCT Pub. No.: WO2020/038796
PCT Pub. Date: Feb. 27, 2020

(65) Prior Publication Data
US 2021/0328422 A1    Oct. 21, 2021

(30) Foreign Application Priority Data

Aug. 24, 2018 (EP) .................................. 18190669

(51) Int. Cl.
*H02J 3/36* (2006.01)
*H02H 7/26* (2006.01)

(52) U.S. Cl.
CPC .............. *H02H 7/268* (2013.01); *H02J 3/36* (2013.01)

(58) Field of Classification Search
CPC ............ H02H 3/05; H02H 7/268; H02H 9/02; H02H 9/041; H02H 3/025; H02H 3/20;
(Continued)

(56) References Cited

U.S. PATENT DOCUMENTS 9,692,226 B2 * 6/2017 Davidson ............... H02H 3/087
9,705,312 B2 * 7/2017 Hedblad ................ H02H 7/268
(Continued)

FOREIGN PATENT DOCUMENTS

CN     107 039 955 A    8/2017
EP      0 353 406 A1    2/1990
(Continued)

OTHER PUBLICATIONS

Search Report & Written Opinion issued in PCT/EP2019/071808, dated Nov. 6, 2019, 21 pages,.

*Primary Examiner* — Vinh P Nguyen
(74) *Attorney, Agent, or Firm* — Eversheds Sutherland (US) LLP (57) ABSTRACT

An electronic valve apparatus for a high voltage direct current, HVDC, power transmission system. The electronic valve apparatus includes a first device chain including a number of first devices connected in series between an input node and an output node. Each of the first devices has an asymmetric transfer function configured substantially to block current flow through the device in a first direction, and the first devices are connected such that they all block current flow in the same direction. The electronic valve apparatus also includes a second device chain including a number of second devices connected in series between the input node and the output node. Each of the second devices has an asymmetric transfer function configured substantially to block current flow through the device in a first direction, (Continued)

and the second devices are connected such that they all block current flow in the same direction.

15 Claims, 8 Drawing Sheets

(58) Field of Classification Search
CPC . H02H 9/021; H02H 3/087; H02J 3/36; H02J 1/10; H02J 1/00; H02J 3/144; H02M 3/155; H03K 17/0826; H03K 17/107; Y02E 60/60; G01R 31/40; G01R 31/64; G01R 31/00; H01H 9/542; H01H 2009/543; H01H 2009/544; H01H 9/547; H01H 9/548; H01H 33/596
See application file for complete search history.

(56) References Cited

U.S. PATENT DOCUMENTS

| | | | |
|---|---|---|---|
| 2017/0047727 A1* | 2/2017 | Cao | H02M 1/32 |
| 2021/0090770 A1* | 3/2021 | Wang | H01F 7/20 |

FOREIGN PATENT DOCUMENTS

| | | |
|---|---|---|
| WO | 2010/069399 A1 | 6/2010 |
| WO | 2011/095212 A2 | 8/2011 |
| WO | 2012/123014 A2 | 9/2012 |
| WO | 2014/177874 A2 | 11/2014 |
| WO | 2015/090365 A1 | 6/2015 |
| WO | 2015090440 A1 | 6/2015 |

* cited by examiner

ELECTRONIC VALVE APPARATUS

CROSS-REFERENCE TO RELATED APPLICATIONS

This application is a U.S. National Stage Application under 35 U.S.C. 371 and claims the priority benefit of International Application No. PCT/EP2019/071808, filed Aug. 14, 2019, which claims priority to European Application No. 18190669.4, filed Aug. 24, 2018, which are both incorporated herein by reference.

FIELD OF THE INVENTION

The present disclosure relates to an electronic valve apparatus for use in a system for transmission of high voltage direct current (HVDC) power.

BACKGROUND

High voltage direct current (HVDC) power transmission is a cost-effective way of transmitting electrical power over long distances. In HVDC systems alternating current (AC) electrical power is converted by an HVDC converter into HVDC electrical power for transmission over transmission lines such as overhead lines or underground/undersea cables to a destination. At the destination, the HVDC power is converted back to AC power by an HVDC converter, for onward distribution to end-user sites via AC electrical distribution infrastructure.

With increasing power demand, particularly in large urban areas, stress on existing AC distribution infrastructure is increasing. To accommodate this increasing demand the capacity of the electrical power distribution network must be increased.

In some schemes, additional power can be generated at remote power generation sites and transmitted directly into the urban environment using HVDC transmission. Such schemes bypass much of the existing power distribution network and so lighten the load on existing infrastructure.

Figure 1:
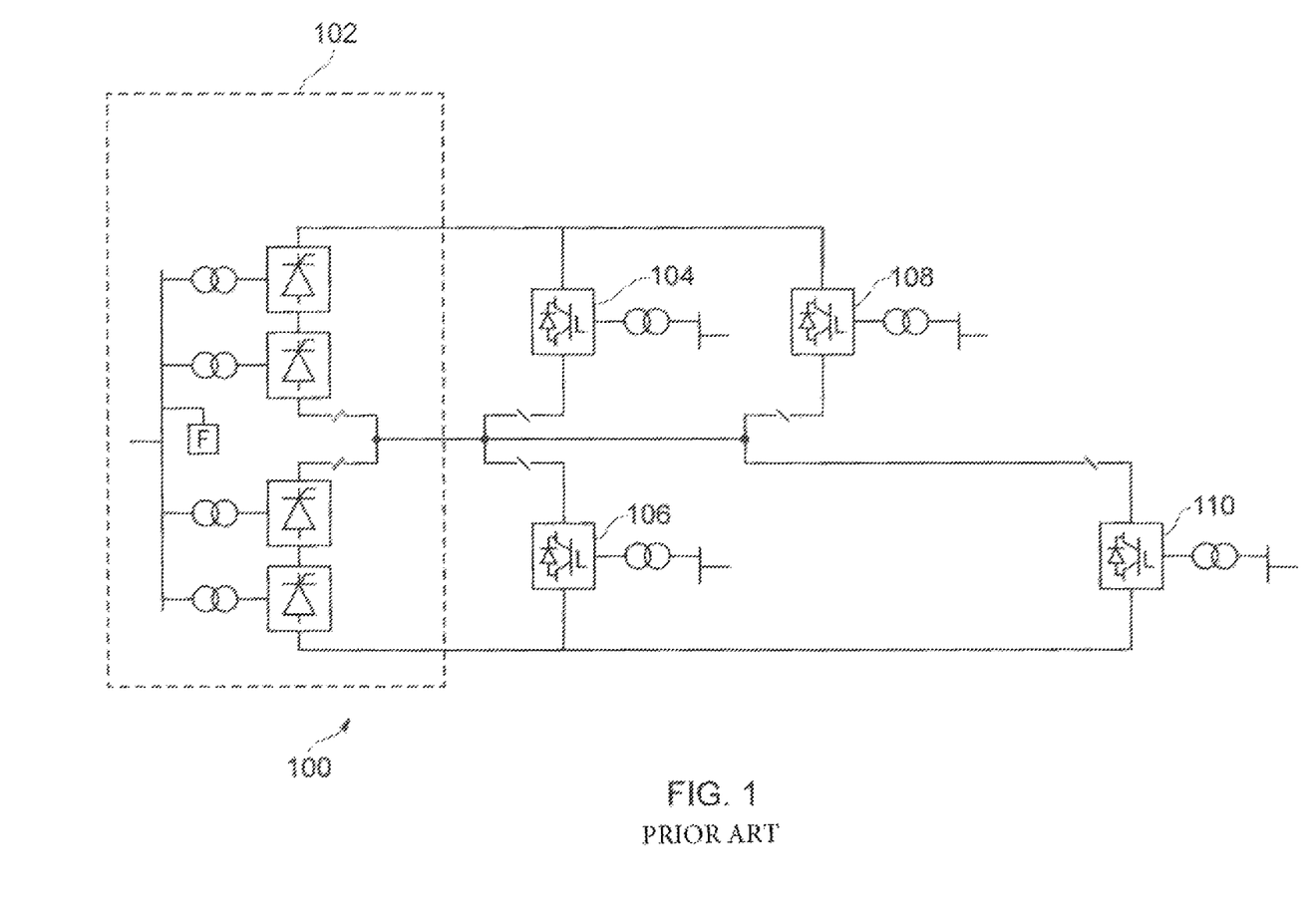
FIG. 1 is a schematic representation of a hybrid bipole High Voltage Direct Current power delivery system.

Bypassing the existing power distribution network can be advantageous, but given improvements in hardware devices, HVDC delivery can be improved. For example, considering the increased current carrying capability of modern thyristors compared with the current carrying capability of modern insulated-gate bipolar transistors (IGBTs) a hybrid scheme may allow power to be injected into the DC network at one location and then delivered through several converters. For example, as shown in FIG. 1, a DC power distribution network 100 may receive power at a single location through one or more line-commutated converters (LCCs) as a bulk power infeed 102 and may deliver power via several urban infeeds 104, 106, 108, 110. The urban infeeds 104, 106, 108, 110 may be, for example, radially connected Voltage Source Converters (VSCs).

Figure 2:
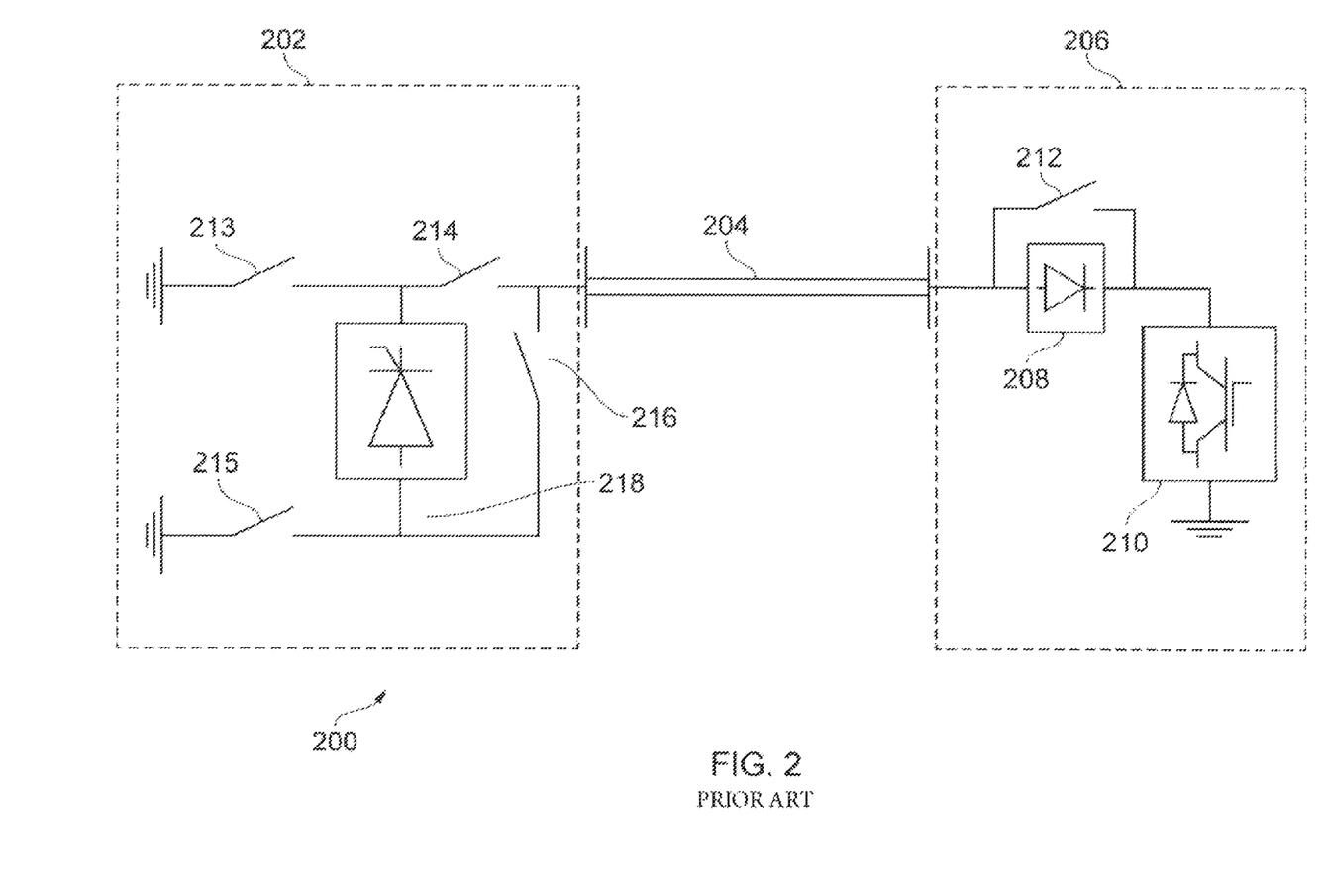
FIG. 2 is a schematic representation of a possible bulk infeed/urban infeed system comprising a hybrid Line-Commutated Converter/Voltage Source Converter High Voltage Direct Current system including a safety valve.

FIG. 2 illustrates a bulk infeed/urban infeed system 200. The bulk infeed/urban infeed system 200 provides a hybrid LCC/VSC system that is suitable for transmitting power from a remote generation system to a load such as a city.

A transmitting (rectifying) end 202 of the system 200 may comprise a line-commutated converter (LCC) 202. LCCs are advantageous for this application because they offer a high power rating, high efficiency and ability to block faults on a HVDC transmission line 204 that connects the transmitting end 202 to a receiving end 206 of the system 200.

Switchgear 213, 214, 215, 216 including earth switches 213, 214 may be provided to enable the polarity of the DC voltage applied to the transmitting end 202 to be changed, which in turn changes the direction of power flow along the transmission line 204.

A receiving (inverting) end 206 of the system 200 may comprise one or more voltage-sourced converters (VSC) 210. VSCs are advantageous for this application because of their ability to operate on weaker AC grids and their smaller physical footprint.

The transmitting end 202 and the receiving end 206 are interconnected by the HVDC transmission line 204, which may be an overhead line, e.g. in rural areas, or an underground cable, e.g. in urban areas.

A safety valve 208 may be located between the HVDC transmission line 204 and the VSC 210. The safety valve 208 may be located at any point on the HVDC transmission line 204 or at any point between the HVDC transmission line 204 and the VSC 210. For example, the safety valve 208 may be provided at an interface point between an overhead cable and an underground cable connecting the transmitting end 202 to the receiving end 206.

A safety valve bypass switch 212 may be provided. The safety valve bypass switch 212 may be closed either: to allow the flow of power in the reverse direction, e.g. receiver 206 to transmitter 202; or when performing maintenance on the safety valve 208. If safety valve bypass switch 212 is closed, there may be an increased risk to the system as if a DC line fault occurs on 204, the entire system may need to be shut down.

The safety valve 208 may comprise a device with an asymmetric transfer function such as one or more diodes or thyristors. The asymmetric transfer function of the device may be configured such that it substantially blocks the flow of current in one direction. In some embodiments, the asymmetric transfer function of the device may be configured such that it substantially blocks the flow of current in one direction while allowing current to flow with relatively low impedance in the other direction.

As will be apparent from FIG. 2, the safety valve 208 carries the full burden of the supplied DC current continuously, unlike the thyristor valves of an LCC. The thyristor valves of an LCC may carry current for only third of the time when the converter comprises three phases, with a thyristor provided for each phase, and the DC line current only flows in one phase at a time. Therefore, the time average power carried by the safety valve 208 may be almost three times higher in a typical system than the power carried by the thyristors of an LCC. The large amount of power carried by the safety valve 208 places significant thermal stress on the safety valve 208.

The thermal duty on the safety valve 208 will be more severe than that of the thyristors of the LCC of the transmitting end 202 (although by less than 3:1, because the safety valve 208, by virtue of its location, carries substantially "pure" DC current and so does not incur any switching losses, whereas the thyristor valves of the LCC may each carry a "chopped" DC current.

This high thermal duty may lead to a decreased life span of the safety valve 208 and an increased need to cool the device, which is disadvantageous.

Accordingly, a need exists to reduce the thermal duty of the safety valve 208.

SUMMARY

According to a first aspect of the present invention there is provided an electronic valve apparatus for a high voltage direct current, HVDC, power transmission system, comprising: a first device chain including a plurality of first devices connected in series between an input node and an output node of the electronic valve apparatus, each of the plurality of first devices having an asymmetric transfer function configured substantially to block current flow through the device in a first direction, wherein the plurality of first devices are connected such that they all block current flow in the same direction; a second device chain including a plurality of second devices connected in series between the input node and the output node, each of the plurality of second devices having an asymmetric transfer function configured substantially to block current flow through the device in a first direction, wherein the plurality of second devices are connected such that they all block current flow in the same direction; wherein the second device chain is connected in parallel with the first device chain.

The first device chain may further comprise a first controllable switching device operable to control a forward flow of current in the first device chain, and the second device chain may further comprise a second controllable switching device operable to control a forward flow of current in the second device chain.

The first device chain may comprise an energy storage device associated with the first controllable switching device, and the second device chain may comprise an energy storage device associated with the second controllable switching device.

The first controllable switching device and the second controllable switching device may be insulated-gate bipolar transistors, for example.

The first device chain may further comprise a second controllable switching device operable to control a flow of current to an associated energy storage device, and the second device chain may further comprise a fourth controllable switching device operable to control a flow of current to an associated energy storage device.

The third and fourth controllable switching devices may be insulated-gate bipolar transistors, for example.

The third controllable switching device may be associated with a first capacitor and wherein the fourth controllable switching device may be associated with a second capacitor.

The third controllable switching device and the fourth controllable switching device may both be associated with a capacitor.

The first controllable switching device and the second controllable switching device may be provided by a first half-bridge submodule, and the third controllable switching device and the fourth controllable switching device may be provided by a second half-bridge submodule.

Alternatively, the first, second, third and fourth controllable switching devices may be provided by a full-bridge submodule.

One or more of the plurality of first devices and one or more of the plurality of second devices may be diodes.

The electronic valve apparatus may further comprise a voltage detector coupled to one or more of the first devices and second devices, the voltage detector being operative to output a signal on detection of a reverse voltage across the device to which the voltage detector is coupled.

The voltage detector may comprise a light source operative to output an optical signal on detection of a reverse voltage across the device to which the voltage detector is coupled.

The light source may be coupled to an optical fibre which transmits the optical signal output to a monitoring station for monitoring a status of the device to which the voltage detector is coupled.

According to a second aspect of the invention there is provided a power delivery system for transmission of high voltage direct current, HVDC, from a generation system to one or more power consuming loads, the power delivery system comprising: a HVDC power transmitting end; a HVDC power receiving end; a transmission line connecting the HVDC power transmitting end to the HVDC power receiving end; and an electronic valve apparatus according to any one of the preceding claims, coupled to the transmission line between the transmission line and the HVDC power receiving end.

According to a third aspect of the invention there is provided a method for testing an electronic valve apparatus according the first aspect, wherein the electronic valve apparatus further comprises a first controllable switching device operable to control a forward flow of current in the first device chain and a second controllable switching device operable to control a forward flow of current in the second device chain, the method comprising: operating one of the first controllable switching device and the second controllable switching device to substantially prevent a forward flow of current in a selected one of the device chains to which the controllable switching device that has been operated belongs; applying a reverse voltage to the plurality of devices of the selected device chain; and detecting a voltage across a device of the selected device chain when the reverse voltage has been applied to the selected device chain.

BRIEF DESCRIPTION OF THE DRAWINGS

Embodiments of the invention will now be described, strictly by way of example only, with reference to the accompanying drawings, of which.

DETAILED DESCRIPTION

Embodiments of the present disclosure implement an electronic safety valve apparatus using a plurality of parallel chains of devices. The use of a plurality of parallel chains of devices distributes the load between the plurality of chains so as to decrease the thermal load on each chain and on each individual device of each of the chains. For example, the plurality of parallel chains of devices may be two or more chains of series-connected diodes, the two or more chains being connected in parallel with each other.

The plurality of parallel chains of devices may comprise, for example, at least two devices in series with each other per chain, at least 3 devices in series with each other per chain, at least five components in series with each other per chain, or at least 10 components in series with each other per chain. A greater number of devices in series provides safety against a larger reverse voltage. Thus, there may be at least 50 (for example 50-100) devices in series with each other per chain.

The devices in each chain comprise at least one device with an asymmetric transfer function. A majority of the devices may be oriented in the same direction in a chain. The parallel chains may be oriented in the same direction. All of the devices in at least one chain of the plurality of chains of devices may have an asymmetric transfer function. The at least one device with an asymmetric transfer function may be, for example, a polarised device, or a semiconductor device. The at least one device with an asymmetric transfer function may be at least one semiconductor device, such as a diode, or a thyristor.

The devices in each chain with an asymmetric transfer function may be configured such that they substantially block the flow of current in one direction while allowing current to flow with relatively low impedance in the other direction. The low impedance direction may also be referred to as the forward direction.

The devices may have a relatively small voltage drop in the relatively low impedance direction, for example the voltage drop may be between 0.1 volt and 3 volts per device, or 1 volt to 2 volts per device.

Each device, or the majority of the devices, of each chain may have a relatively low voltage drop in the forward direction. However, the voltage drop in the reverse direction, or relatively high impedance direction, may be large. The chains may only experience a relatively large, or significant, reverse voltage in the case of a fault with the power transmission system, for example, a high reverse voltage may be experienced by the electronic safety valve apparatus, the plurality of chains of devices, or more specifically the devices, in the event of a line fault in a HVDC power distribution system in which the electronic safety valve apparatus is used. As a line fault, or clearing of a DC line fault, is one of the few times the electronic safety valve apparatus would be operated in the reverse direction, any device failures, such as for example a short circuit, occurring during normal operation may remain undetected.

The failure to detect a fault with the safety valve apparatus is particularly problematic because of the dangers associated with the high currents and high voltages involved in power transmission. It is preferable for the grid operator to know in advance that the electronic safety valve apparatus might not be capable of blocking reverse voltage, so that the safety valve can be bypassed temporarily while work is done on it to restore any failed devices such as diodes. However supplying power to any form of monitoring electronics is particularly problematic due to the high voltages with respect to ground in use in the electronic safety valve apparatus. Once the safety valve 208 is in use, it is too late to find a fault as the electronic safety valve apparatus is in operation, regardless of whether there is a fault.

Each of the plurality of parallel chains of devices may include, in series with the devices with an asymmetric transfer function, at least one controllable switching device.

The controllable switching device may be electronically controlled. For example the controllable switching device may be a semiconductor device such as a transistor or gate-turn-off-thyristor. The controllable switching device may be arranged to control or prevent the flow of current through one or more of the plurality of parallel chains of components. Preventing the flow of current through one or more of the plurality of parallel chains of components may allow diagnosis of faults before the electronic safety valve apparatus is operational to substantially prevent any reverse voltages applied to the electronic safety valve apparatus.

The plurality of parallel chains of devices may comprise a plurality of series-connected diode chains, and the controllable switching device of each of the plurality of parallel chains of devices may be an insulated-gate bipolar transistor (IGBT).

Figure 3:
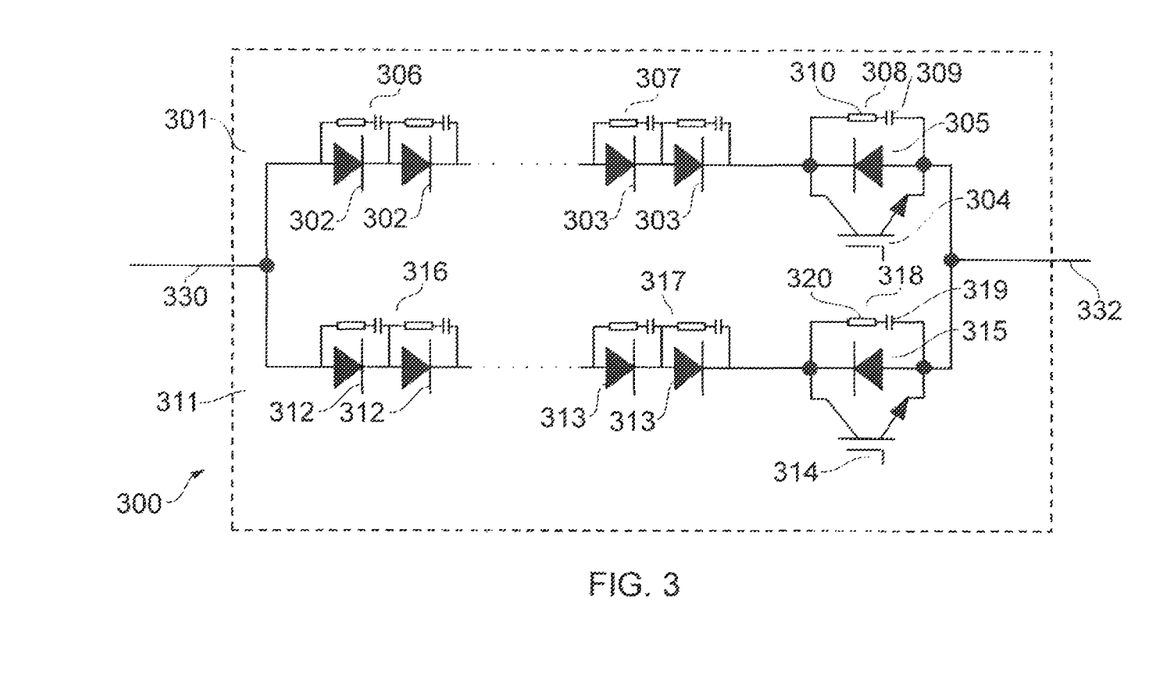
FIG. 3 is a schematic representation of a safety valve apparatus.

Referring now to FIG. 3, a safety valve apparatus 300 is shown generally at 300. The safety valve apparatus 300 has an input node 330 and an output node 332. A plurality (in this example two) of chains 310, 311 of devices are provided between the input 330 node and the output node 332.

The first and second chains 301, 311 are connected in parallel with each other between the input node 330 and the output node 332 of the safety valve apparatus 300. The first chain 301 includes a plurality of devices 302, 303 connected in series. Each of the plurality of devices 302, 303 has an asymmetric transfer function. Similarly, the second chain 311 includes a plurality of devices 312, 313 connected in series, and each of the plurality of devices 312, 313 has an asymmetric transfer function. The devices 302, 303, 312, 313 are shown in the example of FIG. 3 as diodes grouped in pairs, but it will be appreciated that any device or selection of devices with an asymmetric transfer function could be used.

Current flowing from the input node 330 to the output node 332 may be understood to be flowing in a forward direction. In the forward direction the devices 302, 303, 312, 313 present their lowest impedance, whilst in a reverse direction (i.e. a direction of current flow opposite to the forward direction) the devices 302, 303, 312, 313 313 present their highest impedance. It will be appreciated that the devices of the first chain 301 and the devices of the second chain 311 are connected in such a way as to permit current flow in the same direction. Further, it will be appreciated that the first and second chains 301, 311 are connected in such a manner as to permit current flow through the first and second chains 301, 311 in the same direction.

A first controllable switching device 304, referred to hereinafter as a first commutating switch 304, is provided to control the flow of current in the first chain 301, and is connected, in the example illustrated in FIG. 3, in series between the devices 302, 303 of the first chain 301 and the output node 332. It will be appreciated by those skilled in the art that the first commutating switch 304 could equally be provided between the input node 330 and the devices 302, or indeed at any other location in the first chain 301 that would allow it to control the flow of current in the first chain 301. Similarly, a second controllable switching device 314, referred to hereinafter as a second commutating switch 314, is provided to control the flow of current in the second chain 311, and is connected, in the example illustrated in FIG. 3, in series between the devices 312, 313 of the second chain 311 and the output node 332. Again, it will be appreciated by those skilled in the art that the second commutating switch 314 could equally be provided between the input node 330 and the devices 312, or indeed at any other location in the second chain 311 that would allow it to control the flow of current in the second chain 311. The first and second commutating switches 304, 314 may be, for example, insulated-gate bipolar transistors (IGBTs).

In operation of the safety valve apparatus 300, the first and second commutating switches 304, 314 are normally switched on, to allow current flow in the forward direction in the first and second chains 301, 311 respectively. However, each of the first and second commutating switches 304, 314 can be switched off, in order substantially to prevent current flow in the forward direction in the chain 301, 311 with which it is associated. Thus, the first commutating switch 304 may be switched off in order substantially to prevent current flow in the forward direction of the first chain 301, whilst the second commutating switch 314 may be switched off, in order substantially to prevent current flow in the forward direction of the second chain 311.

Current flow in a chain 301, 311 prior to the commutating switch 304, 314 of that chain being switched off will not stop instantly when the commutating switch 304, 314 of that chain is switched off, because of stray inductance around the loop formed by the plurality of chains 301, 311.

Figure 7:
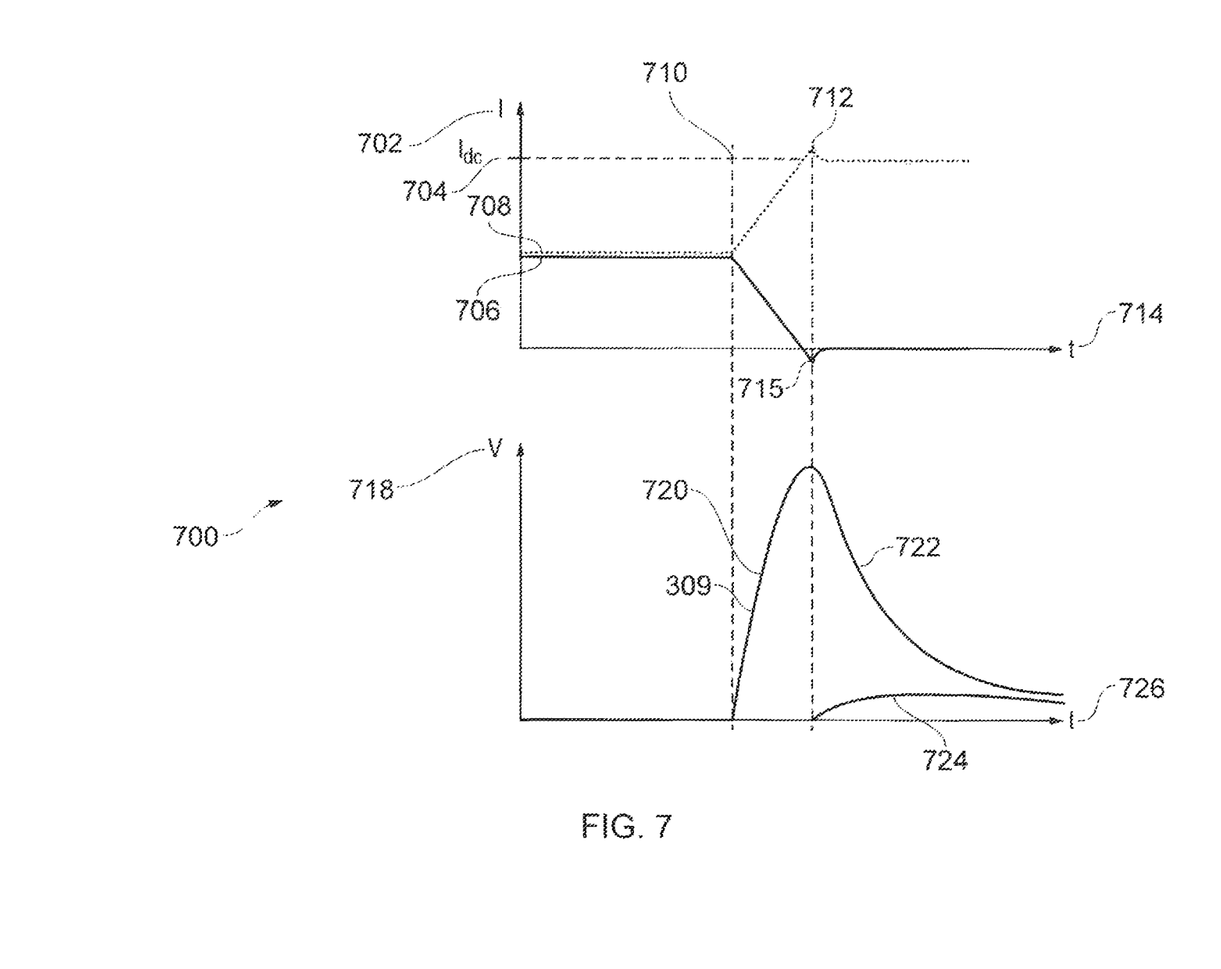
FIG. 7 illustrates example voltage waveforms for an energy storage device associated with the safety valve apparatus and corresponding current waveforms for the respective chains.

Taking the first chain 301 as an example, after the first commutating switch 304 turns off, the current that was flowing in the first chain 301 will continue to flow as a result of stray inductance. As the current continuing to flow can no longer flow through the first commutating switch 304, it will flow instead into an energy storage device 309 associated with the first commutating switch 304, causing the energy storage device 309 to store energy. As the energy storage device 309 stores energy it starts to develop a back-emf (electromotive force) which causes the current in the first chain 301 to decrease and the current in the other chain(s) 311 to increase. After a time period, which may be relatively small (e.g. of the order of 100 microseconds), the current in the devices 302, 303 of the first chain 301 drops to zero and therefore, those devices turn off. Current will then be fully commutated to the other chain 311 and the voltage on the energy storage device 309 will re-distribute its stored energy across energy storage devices of snubber circuits 306, 307, 308 associated with the devices of the first chain 301 (which will be described in more detail below), causing each to charge up to a voltage. A specific example of this behaviour with respect to the first chain 301 is shown in FIG. 7. It will of course be appreciated that the second chain 311 behaves in the same way.

The first commutating switch 304 may be switched off occasionally or periodically, for a short period of time, in order to divert current away from the first chain 301 to allow the devices of the first chain 301 to be tested. Similarly, the commutating switch 314 may be switched off occasionally or periodically, for a short period of time, in order to divert current away from the second chain 311 to allow the devices of the second chain 311 to be tested.

Diverting current away from one chain may increase the load placed on the other chain(s). Therefore, diversion of current away from one chain is advantageously performed for a relatively short period of time. More specifically, the diversion of current away from one chain is advantageously performed for the minimum period of time necessary to establish that the components with an asymmetric transfer function of that chain are supporting reverse voltage. After this minimum period of time, current is then restored to that chain.

Circuits suitable for forcing the off-state voltage, across the series connected devices 303, 303, 312, 313 of the chains 301, 302 to be shared relatively uniformly when the devices are reverse-biased and/or limiting and/or damping the voltage overshoot that may occur after the devices 303, 303, 312, 313 turn off may be provided. The circuits may also be suitable for compensating electromagnetic interference (EMI). Such circuits may be referred to as snubber circuits and may be provided for some or all of the devices 302, 303, 312, 313 of the first and second chains 301, 311.

Snubber circuits may be provided for some or all of the devices 302, 303, 312, 313 of the first and second chains 301, 311 as shown in FIG. 3. For example, each of the devices 302 of the first chain 301 in FIG. 3 may be provided with a snubber circuit 306 including a first resistor and a first capacitor connected in series, with the series-connected first resistor and capacitor being connected in parallel with the device 302. Similar snubber circuits may be provided for the other devices 303, 312, 313 in the first and second chains 301, 311.

As will be appreciated by those skilled in the art, the resistor capacitor (RC) snubber circuit illustrated in FIG. 3 and described above is only one example of a suitable snubber circuit, and alternative snubber circuits may be implemented using a variety of configurations. For example, a snubber circuit may be implemented using a more complex network such as an RCD network or a less complex network such as a single capacitor or resistor.

When a snubber circuit is presented with a sharp change in voltage, as may happen when the current is prevented from flowing through one of the plurality of chains by a switching device, the circuit acts to limit and/or damp the voltage.

In order to test the devices 302, 303, 312, 313 of a chain 301, 311 a reverse voltage must be applied to the devices. To this end, it is advantageous if the commutating switches 304, 314 have some associated energy storage. In the example illustrated in FIG. 3, energy can be stored in first and second capacitors 309, 319 associated, respectively, with the first and second commutating switches 304, 314. However, it will be appreciated that alternative energy storage devices such as inductors or batteries could be provided. The first and second capacitors 309, 319 (or alternative energy storage devices) may be located in proximity to the first and second commutating switches 304, 314, for example in a common enclosure. Typically the first and second capacitors 309, 319 (or alternative energy storage devices) are located within a few tens of centimetres of their associated commutating switches 304, 314, to minimise stray inductance.

The first capacitor 309 is connected in series with a first resistor 310, and, as discussed above, the series combination of the first capacitor 309 and the first resistor 310 forms a first snubber circuit 308 which is connected to current conducting terminals of the first commutating switch 304. Thus, in the example illustrated in FIG. 3, a first terminal of the first snubber circuit 308 is connected to a node between the component 303 and a first current conducting terminal of the first commutating switch 304, so as to connect the first resistor 310 of the first snubber circuit 308 to the first current conducting terminal of the first commutating switch 304. A second terminal of the first snubber circuit 308 is connected to a node between the output 332 and a second current conducting terminal of the first commutating switch 304, so as to connect the first capacitor 309 of the first snubber circuit 308 to the second current conducting terminal of the first commutating switch 304. In some examples the first resistor 310 may be omitted.

Similarly, the second capacitor 319 is connected in series with a second resistor 320, and the series combination of the second capacitor 319 and the second resistor 320 forms a second snubber circuit 318 which is connected to current conducting terminals of the second commutating switch 314. Thus, in the example illustrated in FIG. 3, a first terminal of the second snubber circuit 318 is connected to a node between the component 313 and a first current conducting terminal of the second commutating switch 314, so as to connect the second resistor 320 of the second snubber circuit 318 to the first current conducting terminal of the second commutating switch 320. A second terminal of the second snubber circuit 318 is connected to a node between the output 332 and a second current conducting terminal of the second commutating switch device 314, so as to connect the second capacitor 319 of the second snubber circuit 318 to the second current conducting terminal of the second commutating switch 314. In some examples the second resistor 320 may be omitted.

The first capacitor 309 of the first snubber circuit 308 of FIG. 3 allows a reverse voltage to be applied to the devices 302, 303 of the first chain 301 after the first commutating switch 304 has been switched off and current has ceased to flow in the forward direction in the first chain 301 and the devices 302, 303 have been substantially turned off. The first resistor 310, if provided, limits the discharge current into the first commutating switch 304 when the first commutating switch 304 is switched on again.

Similarly, the second capacitor 319 in the second snubber circuit 318 of FIG. 3 allows a reverse voltage to be applied to the devices 312, 313 of the second chain 311 after the second controllable switching device 314 has been switched off and current has ceased to flow in the forward direction in the second chain 311 and the devices 312, 313 have been substantially turned off. The second resistor 320, if provided, limits the discharge current into the second commutating switch 314 when the second commutating switch 314 is switched on again.

Additionally, first and second freewheeling diodes 305, 315 may be provided, connected in the reverse direction across the current conducting terminals of the first and second commutating switches 304, 314. The first and second freewheeling diodes 305, 315 protect the first and second commutating switches 304, 314 against high reverse voltages which may be applied to the first and second commutating switches 304, 314. For example, if the commutating switches were IGBTs, they may be able to withstand 3300 v in the current-carrying (forward) direction, but only 30 v in the opposite (reverse) direction. Therefore the freewheeling diodes are arranged to substantially prevent current flowing through the first and second commutating switches in the reverse direction to prevent damage.

When the first commutating switch 304 is switched off to prevent the flow of current in the first chain 301 in order to test the devices 302, 303 of the first chain 301, the first capacitor 309 associated with the first commutating switch 304 charges up as a result of the forward current that continues to flow in the first chain 301 because of the stray inductance in the chains 301, 311 after the first commutating switch 304 is turned off. A voltage thus develops across the first capacitor 309, which causes current flowing into the safety valve apparatus 300 to enter the second chain 311. Thus, the voltage that develops across the first capacitor 309 causes current to commutate into the second chain 311 (hence the term "commutating voltage"). Assuming the stray inductance is relatively small, only a relatively small commutating voltage is required to "push" the current into another chain in this way. The commutating voltage may be, for example of the order of 2-3 kV, which may be provided by a single IGBT without the need for additional resources.

After the current in the devices 302, 303 has substantially fallen to zero and those devices have stopped conducting, the voltage that develops across the first capacitor 309 also appears as reverse voltage across the devices 303, 302 of the first chain 301, and thus can be used to test whether those devices 303, 302 are functioning correctly to block reverse voltage.

Similarly, when the second commutating switch 314 is switched off to prevent the flow of current in the second chain 311 in order to test the components 312, 313 of the second chain 311, the second capacitor 319 associated with the second commutating switch 314 charges up as a result of the forward current that continues to flow in the second chain 311 because of the stray inductance in the chains 301, 311 after a commutating switch 314 is turned off. A voltage thus develops across the second capacitor 319, which causes current flowing into the safety valve apparatus 300 to enter the first chain 301. Thus, the voltage that develops across the second capacitor 319 causes current to commutate into the first chain 301 (hence the term "commutating voltage").

After the current in the devices 312, 313 has substantially fallen to zero and those devices have stopped conducting, the voltage that develops across the second capacitor 319 also appears as reverse voltage across the devices 313, 312 of the second chain 311, and thus can be used to test whether those devices 313, 312 are functioning correctly to block reverse voltage.

Figure 4:
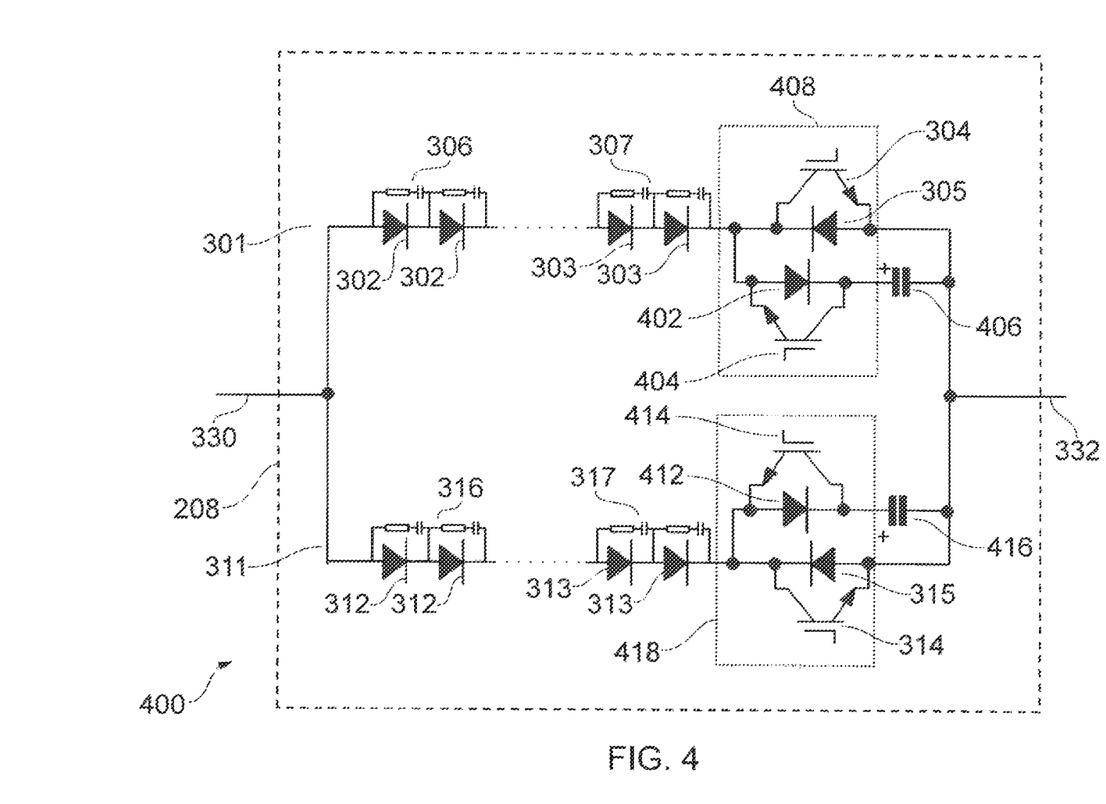
FIG. 4 is a schematic representation of a safety valve apparatus incorporating two half-bridge submodules.

FIG. 4 is a schematic representation of an alternative safety valve apparatus 400. The alternative safety value apparatus 400 of FIG. 4 has many of the same components as the safety valve apparatus 300 of FIG. 3, and thus like reference numerals are used in FIGS. 3 and 4 to refer to like components.

The alternative safety valve apparatus 400 of FIG. 4 differs from the safety valve apparatus 300 of FIG. 3 in that the alternative safety valve apparatus 400 incorporates first and second half-bridge submodules 408, 418 in the respective first and second parallel connected chains 301, 311 of devices to control the flow of current in the first and second chains 301, 311.

The first half-bridge submodule 408 in the illustrated example comprises a first controllable switching device 304, referred to hereinafter as a first commutating switch 304, and a second controllable switching device 404, referred to hereinafter as a first test switch 404. The first commutating switch 304 and the first test switch 404 of the first half-bridge module 408 may be electrical switches and may be manufactured with substantially matching electrical parameters. The first commutating switch 304 and the first test switch 404 of the first half-bridge module 408 may be, for example, IGBTs, gate turn-off thyristors, or bipolar junction transistors.

The first commutating switch 304 is connected as in the safety valve apparatus 300 of FIG. 3, with its current carrying terminals being connected in series between the devices 302, 303 of the first chain 301 and the output node 332. Current carrying terminals of the first test switch 404 are connected in series between the components 302, 303 of the first chain 301 and a first terminal of a first capacitor 406, which has a second terminal that is connected to the output node 332.

The first commutating switch 304 and the first test switch 404 of the first half-bridge module 408 may be provided with freewheeling diodes 305, 402, which prevent damage to the associated commutating switch.

Similarly, the second half-bridge submodule 418 in the illustrated example comprises a third controllable switching device 314, referred to hereinafter as a second commutating switch 304, and a fourth controllable switching device 414, referred to hereinafter as a second test switch 414. The second commutating switch 314 and the second test switch 414 of the second half-bridge submodule 418 may be electrical switches and may be manufactured with substantially matching electrical parameters. The second commutating switch 314 and the second test switch 414 of the second half-bridge submodule 418 may be, for example, IGBTs, gate turn-off thyristors, or bipolar junction transistors.

The second commutating switch 314 is connected as in the safety valve apparatus 300 of FIG. 3, with its current carrying terminals being connected in series between the devices 312, 313 of the second chain 311 and the output node 332. Current carrying terminals of the second test switch 414 are connected in series between the devices 312, 313 of the second chain 311 and a first terminal of a second capacitor 416, which has a second terminal that is connected to the output node 332.

The second commutating switch 314 and the second test switch 414 of the second half-bridge submodule 418 may be provided with freewheeling diodes 315, 412, which prevent damage to the associated commutating switch.

In normal operation of the safety valve apparatus 400 of FIG. 4, the first commutating switch 304 and the second commutating switch 314 are both switched on. Current is therefore able to flow in the forward direction in both the first and second chains 301, 311.

When it is desired to test the devices 302, 303 of the first chain 301, the first commutating switch 304 is switched off, and the first test switch 404 of the first chain 301 is switched on. As in the apparatus 300 of FIG. 3, current flow in the first chain 301 does not stop immediately, due to stray inductance. Current that continues to flow in the forward direction of the first chain 301 due to stray inductance causes the first capacitor 406 to charge up. A commutating voltage develops across the first capacitor 406, causing current at the input node 330 of the safety valve apparatus 400 to flow into the second chain 311. After the flow of current in the devices 302, 303 has substantially stopped, the commutating voltage that develops across the first capacitor 406 also appears as reverse voltage across the devices 303, 302 of the first chain 301, and thus can be used to test whether those devices 303, 302 are functioning correctly to block reverse voltage.

Similarly, when it is desired to test the devices 312, 313 of the second chain 311, the second commutating switch 314 is switched off, and the second test switch 414 of the second chain 311 is switched on. As in the apparatus 300 of FIG. 3, current flow in the second chain 311 does not stop immediately, due to stray inductance. Current flowing in the forward direction of the second chain 311 causes the second capacitor 416 to charge up. A commutating voltage develops across the second capacitor 416, causing current at the input node 330 of the safety valve apparatus 400 to flow into the first chain 301. After the flow of current in the devices 312, 313 has substantially stopped, the commutating voltage that develops across the second capacitor 416 also appears as reverse voltage across the devices 313, 312 of the second chain 311, and thus can be used to test whether those devices 313, 312 are functioning correctly to block reverse voltage.

Figure 5:
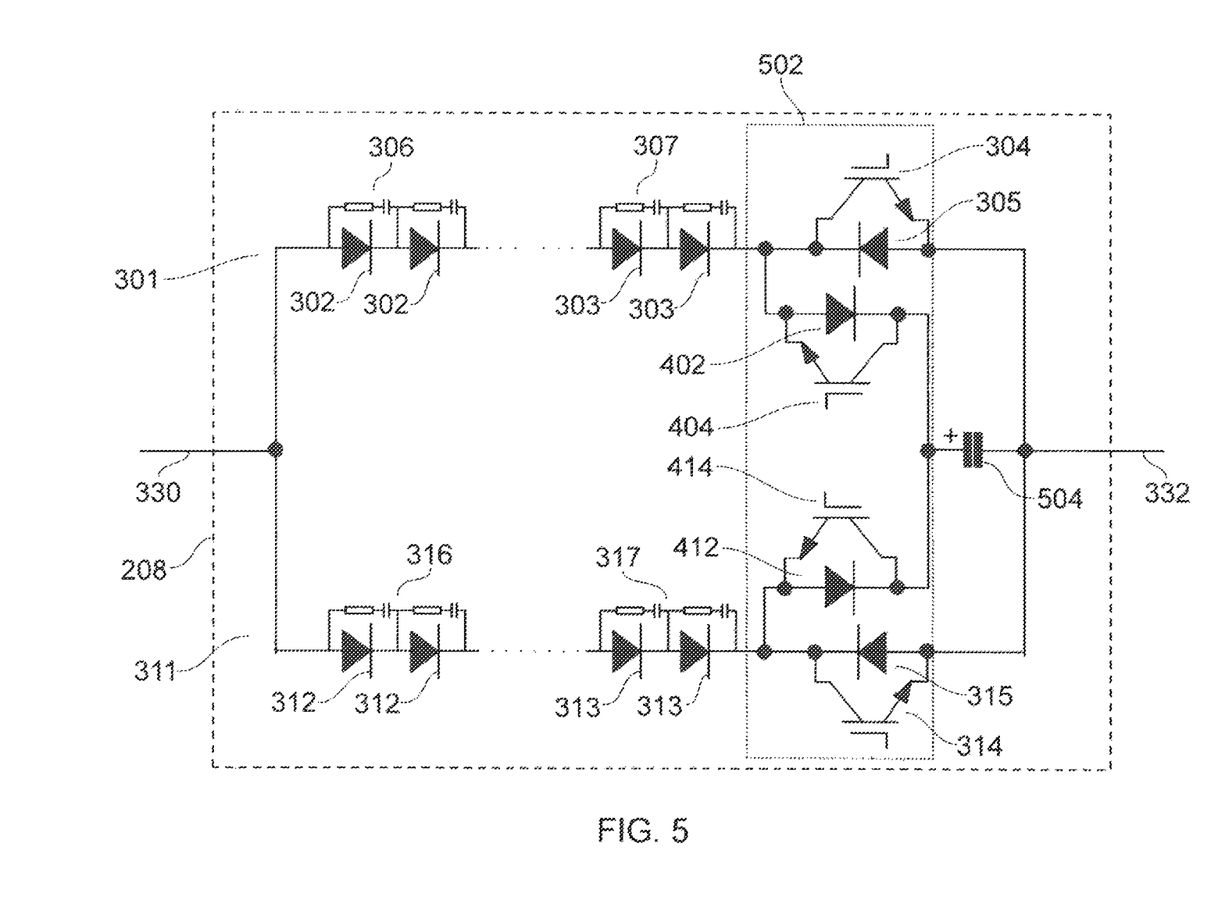
FIG. 5 is a schematic representation of a safety valve apparatus incorporating a full-bridge submodule.

FIG. 5 is a schematic representation of a further alternative safety valve apparatus 500 incorporating a full-bridge submodule. The further alternative safety valve apparatus 500 of FIG. 5 has many of the same components as the safety valve apparatus 300 of FIG. 3, and the alternative safety valve apparatus 400 of FIG. 4 and thus like reference numerals are used in FIGS. 3, 4 and 5 to refer to like components.

The further alternative safety valve apparatus 500 of FIG. 5 differs from the alternative safety valve apparatus 400 of FIG. 4 in that it uses a full-bridge module 502 in place of the two half-bridge modules of the alternative safety valve apparatus 400 of FIG. 4, and in that, instead of using individual first and second capacitors 406, 416, a single capacitor 504 is provided as an energy storage component.

The full-bridge module 502 includes a first commutating switch 304 and a first test switch 404 associated with the first chain 301, and a second commutating switch 314 and second test switch 414 associated with the second chain 311. The first and second commutating switches 304, 314 and the first and second test switches 404, 414 are similar in configuration and function to the corresponding components of the alternative safety valve apparatus 400 of FIG. 4 and thus will not be described in detail here for the sake of brevity.

A first terminal of the capacitor 504 is connected to both the first test switch 404 and the second test switch 414, whilst a second terminal of the capacitor 504 is connected to the output 332 of the apparatus, such that when either the first test switch 404 or the second test switch 414 is switched on, a current path exists between the input node 330 and the capacitor 504, allowing the capacitor 504 to charge up. As the first test switch 404 and the second test switch 414 are never switched on simultaneously (because testing is performed for only one of the chains 301, 311 at a time), the single capacitor 506 of the apparatus 500 can replace the two capacitors 406, 416 of the apparatus 400 of FIG. 4.

Testing of the devices 302, 303, 312, 313 of the first and second chains 301, 311 of the apparatus 500 of FIG. 5 is performed in the manner described above for the apparatus 400 of FIG. 4, with the exception that instead of charging either the first capacitor 406 of the first chain 301 when the devices 302, 303 of the first chain are being tested, or charging the second capacitor 416 of the second chain 311 when the devices 312, 313 of the second chain 311 are being tested, the capacitor 504 is charged when the devices of either the first chain 301 or the second chain 311 are being tested.

In the apparatus of FIGS. 4 and 5, the energy stored in the capacitors 406, 416 (FIG. 4) or 504 (FIG. 5) can be controlled to maintain a desired voltage value across the capacitors using closed-loop control, by adjusting the duration for which the commutating switches 304, 314 are turned off such that current is diverted to capacitors 406, 416, 504. In this way, the voltage across the capacitors can be maintained within a target range, regardless of the load current flowing in the apparatus 400, 500.

Figure 6:
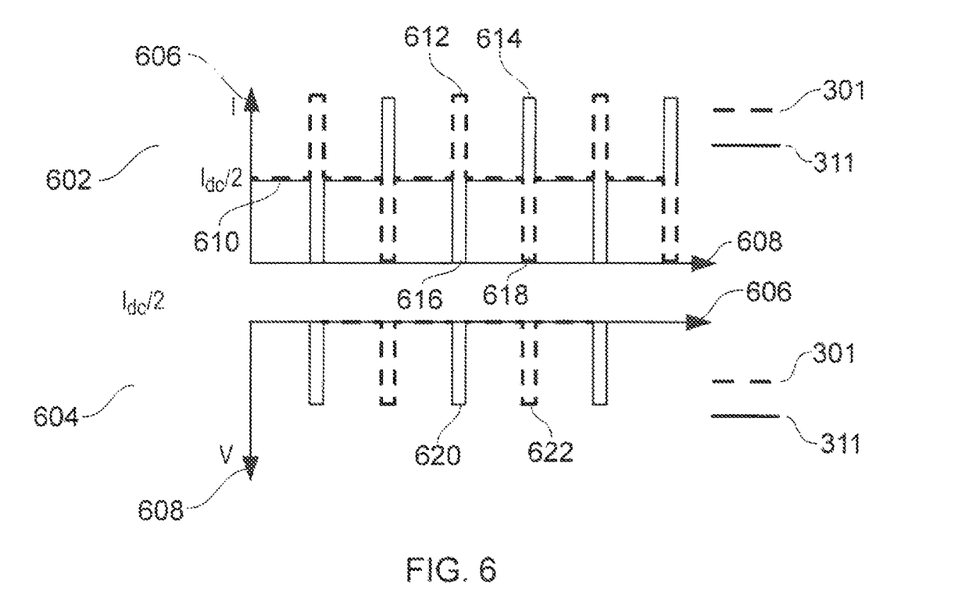
FIG. 6 illustrates example voltage and current waveforms for the safety valve apparatus of FIG. 3.

FIG. 6 illustrates example current and voltage waveforms 602, 604 for the apparatus 300 illustrated in FIG. 3. The example current waveform 602 shows current against time, whilst the example voltage waveform 604 shows voltage against time. The time axes of the current and voltage waveforms 602, 604 are aligned.

During normal operation of the apparatus 300, the devices 302, 303 of the first chain 301 are forward biased and the devices 312, 313 of the second chain 311 are also forward biased. A current $I_{dc}/2$ (where $I_{dc}$ is the DC current at the input node 330) therefore flows in both chains 301, 302, as illustrated, for example, at 610.

A peak 612 representing a period of increased forward current flow in the first chain 301 can be observed in the current waveform 602. A trough 616 representing a period of no forward current flow in the second chain 311 at the same time as the peak 612 can be observed in the current waveform 602. A trough 620 representing a period of negative voltage for the second chain 311 can be observed in the voltage waveform 604 at the same time, indicating that a reverse voltage is present in the second chain 311 at this time.

A peak 614 representing a period of increased forward current flow in the second chain 311 can be observed in the current waveform 602. A trough 618 representing a period of no forward current flow in the first chain 301 at the same time as the peak 614 can be observed in the current waveform 602. A trough 622 representing a period of negative voltage for the first chain 301 can be observed in the voltage waveform 604 at the same time, indicating that a reverse voltage is present in the first chain 301 at this time.

Thus, the waveforms of FIG. 6 reflect the operation of the apparatus 300. Current is diverted from the second chain 311 to the first chain 301 at a time corresponding to peak 612 and trough 616, and a reverse voltage appears substantially simultaneously in the second chain 311 (trough 620) to test the operation of the devices 312, 313 of the second chain 311. Similarly, current is diverted from the first chain 301 to the second chain 311 at a time corresponding to peak 614 and trough 618, and a reverse voltage appears substantially simultaneously in the first chain 301 (trough 622) to test the operation of the devices 302, 303 of the first chain 301.

As will be appreciated, current and voltage waveforms for the apparatus 400 of FIG. 4 and the apparatus 500 of FIG. 5 would be similar to the current and voltage waveforms 602, 604 of FIG. 6.

The reverse voltage developed across each device 302, 303, 312, 313 of the first and second chains 301, 311 would, in normal operation (i.e. when testing the devices 302, 303, 312, 313 with reverse voltage), be quite small. For example, in a 500 kV transmission system the safety valve apparatus, if constructed using diodes, would need around one hundred diodes connected in series to substantially prevent the flow of reverse current. In this example, if a single IGBT is used as a commutating switch and a commutating voltage of 3 kV is developed, then each diode will experience approximately 30V reverse voltage.

The reverse voltage provided in this example is able to power a simple voltage detector, such as a super luminescent diode (SLD), or a light-emitting diode (LED) and series resistor. A suitable power supply circuit may optionally be provided to aid in removing undesirable traits from the supplied power such as supply noise or ripple. In some embodiments, a signal from the voltage detector can be transmitted to indicate the status of the device with an asymmetrical transfer function. For example, the voltage of a latching circuit may be transmitted or the light from the LED can be coupled into an optical fibre and sent to a monitoring system at ground level. The LED based system may be particularly advantageous as it does not suffer significantly from electrical interference.

Although during normal operation the reverse voltage across the devices 302, 303, 312, 313 (e.g. diodes) of the plurality of chains 301, 311 is quite small, when the safety valve apparatus 300, 400, 500 is assisting in clearing a line fault, the devices 302, 303, 312, 313 of the chains 301, 310 may be required to handle much higher voltages, e.g. of the order of 5 kV per device transiently. Therefore it is advantageous for a power supply circuit to be capable of providing adequate power at relatively low voltage, for example below 30V, while being tolerant of relatively higher voltages for short periods of time. For example, relatively higher voltages in this context may be more than 100 times higher than the relatively low voltage.

FIG. 7 shows an example voltage waveform for an energy storage device of the safety valve apparatus and corresponding current waveforms for the respective chains of the safety valve apparatus. In this example, the waveforms depicted will be described with reference to testing the first chain 301, but it will be appreciated that the principles described here apply to any chain of the safety valve apparatus.

The waveforms 700 of FIG. 7 show current 702 against time 714 and voltage 718 against time 726. The total current flowing in the first chain is represented by the trace 706, whilst the total current flowing in the second chain 311 is represented by the trace 708. The voltage of the capacitor 309 is shown by the trace 720, 722. The voltage of one of the capacitors of the snubber circuits 306, 307 is represented by the trace 724.

The chains may start in steady state, each carrying an equal share of the current. In this state, no substantial voltage appears on the capacitors of snubber circuits 306, 307, nor is there a substantial voltage on capacitor 309.

At time 710 the first commutating switch 304 turns off. The current that was flowing in the first chain 301 will attempt to continue to flow as a result of the stray inductance in the chains. As the current can no longer pass through the first commutating switch 304, the current instead flows into capacitor 309. This causes capacitor 309 to charge at time 710, as indicated by the increasing voltage as shown in 720. As capacitor 309 charges up, it starts to develop a back-emf (electromotive force) which causes the current in 301 to decrease and the current in the second chain 311 to increase at the rate $di/dt=V/L$ (where V is the voltage on the capacitor 309 and L is the stray inductance). As the commutating voltage is established, the devices 302, 303 of the first chain 301 briefly become reverse biased as shown by 715. The current in the devices 302, 303 of the first chain 301 drops to zero, and thus those devices turn off. Current will then be fully commutated to chain 311 and the voltage on capacitor 309 will then re-distribute across the capacitors of all the snubber circuits of the chain 301, causing each to charge up. The capacitors of the snubber circuits of the chain 301 may charge to a voltage of the order of 30 V. This voltage allows the devices 302 303 of the chain 301 to be tested.

Figure 8:
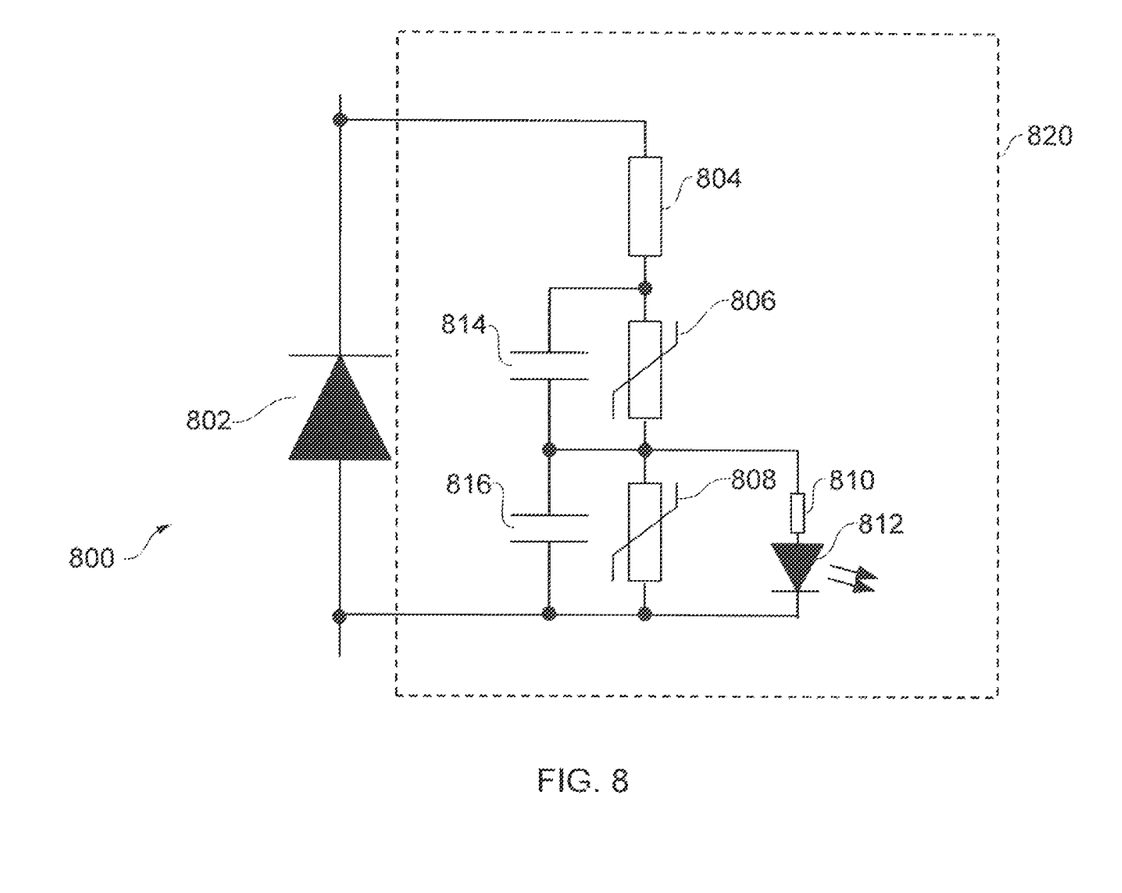
FIG. 8 is a schematic representation of a power supply system for driving a voltage detector.

FIG. 8 is a schematic representation of a power supply system 800 for driving a voltage detector. The power supply system 800 in this example is a snubber-derived power supply system which is suitable for powering a monitoring LED 812.

The power supply system 800 comprises a modified snubber circuit 820 including a first resistor 804 connected in series with first and second varistors 806, 808. A first capacitor 814 is connected in parallel with the first varistor 806, and a second capacitor 816 is connected in parallel with the second varistor 808. The LED 812 and an associated series resistor are also connected in parallel with the second varistor 808. The modified snubber circuit 820 is connected in parallel with a device such as a diode 802 which forms part of the first or second chain 301, 311 of devices. For example, a modified snubber circuit 820 may be connected in parallel with each of the devices of the device pairs 302, 303, 312, 313 of the first and second chains 301, 311, in place of the snubber circuits 306, 307, 316, 317 shown in FIG. 3, for example.

When the diode 802 is allowing current to flow in a forward direction, no voltage appears across the first and second capacitors 814, 816. In contrast, when the diode 802 is blocking the flow of current in the reverse direction, a voltage appears across the two capacitors. The capacitance values of the first and second capacitors 814, 816 are selected such that that, at very low voltages, most of the voltage appears across a low-voltage branch made up of the second capacitor 816, second varistor 808 and LED 812, causing the LED to light. At higher voltages, the varistor 808 of the low voltage branch 808 limits the voltage on the low-voltage branch to a near-constant level and the difference is applied across a higher-voltage branch made up of the first capacitor 814 and the first varistor 814. In some implementations, depending on the desired operational voltages, the first varistor 814 may be omitted.

The light output by the LED may be coupled into an optical fibre and transmitted to a remote monitoring system. The remote monitoring system may be, for example, at ground level relatively near the safety valve device, or located at a different site.

As will be appreciated from the foregoing discussion, the plurality of parallel chains 301, 311 of devices used in the electronic valve apparatus 300, 400, 500 of the present disclosure permit the thermal load that must be borne by the electronic valve apparatus 300, 400, 500 in use to be shared, thereby reducing the risk of failure of the electronic valve apparatus 300, 400, 500 or its individual devices due to thermal overload. Furthermore, the electronic valve apparatus 300, 400, 500 permits simple and effective reverse voltage testing of the individual devices 302, 303, 312, 313 of the plurality of chains 301, 311 of devices, thus facilitating timely diagnosis and repair of faulty devices.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality. Any reference signs in the claims shall not be construed so as to limit their scope.

The invention claimed is:

1. An electronic valve apparatus for a high voltage direct current, HVDC, power transmission system, comprising:
   a first device chain including a plurality of first devices connected in series between an input node and an output node of the electronic valve apparatus, each of the plurality of first devices having an asymmetric transfer function configured substantially to block current flow through the device in a first direction while allowing current to flow with low impedance in the other direction, wherein the plurality of first devices are connected such that they all block current flow in the same direction;
   a second device chain including a plurality of second devices connected in series between the input node and the output node, each of the plurality of second devices having an asymmetric transfer function configured substantially to block current flow through the device in the first direction while allowing current to flow with low impedance in the other direction, wherein the plurality of second devices are connected such that they all block current flow in the same direction;
   wherein the second device chain is connected in parallel with the first device chain.

2. The electronic valve apparatus according to claim 1, wherein the first device chain further comprises a first controllable switching device operable to control a forward flow of current in the first device chain, and wherein the second device chain further comprises a second controllable switching device operable to control a forward flow of current in the second device chain.

3. The electronic valve apparatus according to claim 2, wherein the first device chain comprises an energy storage device associated with the first controllable switching device, and wherein the second device chain comprises an energy storage device associated with the second controllable switching device.

4. The electronic valve apparatus according to claim 2, wherein the first controllable switching device and the second controllable switching device are insulated-gate bipolar transistors.

5. The electronic valve apparatus according to claim 2, wherein the first device chain further comprises a third controllable switching device operable to control a flow of current to an associated energy storage device, and wherein the second device chain further comprises a fourth controllable switching device operable to control a flow of current to an associated energy storage device.

6. The electronic valve apparatus according to claim 5, wherein the third and fourth controllable switching devices are insulated-gate bipolar transistors.

7. The electronic valve apparatus according to claim 5, wherein the third controllable switching device is associated with a first capacitor and wherein the fourth controllable switching device is associated with a second capacitor.

8. The electronic valve apparatus according to claim 5, wherein the third controllable switching device and the fourth controllable switching device are both associated with a capacitor.

9. The electronic valve apparatus according to claim 5, wherein the first controllable switching device and the second controllable switching device are provided by a first half-bridge submodule and wherein the third controllable switching device and the fourth controllable switching device are provided by a second half-bridge submodule.

10. The electronic valve apparatus according to claim 5, wherein the first, second, third and fourth controllable switching devices are provided by a full-bridge submodule.

11. A method for testing an electronic valve apparatus according to claim 2, the method comprising:
    operating one of the first controllable switching device and the second controllable switching device to substantially prevent a forward flow of current in a selected one of the device chains to which the controllable switching device that has been operated belongs;
    applying a reverse voltage to the plurality of devices of the selected device chain; and
    detecting a voltage across a device of the selected device chain when the reverse voltage has been applied to the selected device chain.

12. The electronic valve apparatus according to claim 1, wherein one or more of the plurality of first devices and one or more of the plurality of second devices are diodes.

13. The electronic valve apparatus according to claim 1 further comprising a voltage detector coupled to one or more of the first devices and second devices, the voltage detector being operative to output a signal on detection of a reverse voltage across the device to which the voltage detector is coupled.

14. The electronic valve apparatus according to claim 13 wherein the voltage detector comprises a light source operative to output an optical signal on detection of a reverse voltage across the device to which the voltage detector is coupled.

15. A power delivery system for transmission of high voltage direct current, HVDC, from a generation system to one or more power consuming loads, the power delivery system comprising:
    a HVDC power transmitting end;
    a HVDC power receiving end;

a transmission line connecting the HVDC power transmitting end to the HVDC power receiving end; and an electronic valve apparatus according to claim 1, coupled to the transmission line between the transmission line and the HVDC power receiving end.

* * * * *